United States Patent
Cosley et al.

(10) Patent No.: US 6,317,320 B1
(45) Date of Patent: Nov. 13, 2001

(54) COOLING SYSTEM FOR ELECTRONIC COMPONENTS IN AN EQUIPMENT ENCLOSURE

(75) Inventors: Michael R. Cosley, Crystal Lake; Marvin P. Garcia, Bloomingdale; Don C. Mueller, Aurora, all of IL (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/664,655

(22) Filed: Sep. 19, 2000

(51) Int. Cl.[7] .................................................. H05K 7/20
(52) U.S. Cl. ........................ 361/695; 361/690; 361/694; 174/16.1; 174/15.1; 312/223.1; 454/184
(58) Field of Search ........................................ 361/677, 678, 361/689–695; 174/15.1, 16.1; 165/80.2, 80.3, 104.33, 104.34, 185; 454/184

(56) References Cited

U.S. PATENT DOCUMENTS

| | | |
|---|---|---|
| 4,262,317 | 4/1981 | Baumbach . |
| 4,751,872 * | 6/1988 | Lawson, Jr. ........................ 454/184 |
| 4,901,188 | 2/1990 | Gilberts . |
| 5,001,602 | 3/1991 | Suffi et al. . |
| 5,136,463 | 8/1992 | Webster . |
| 5,523,916 | 6/1996 | Kaczmarek . |
| 5,562,410 * | 10/1996 | Sachs et al. ........................ 361/695 |
| 5,570,740 | 11/1996 | Flores et al. . |
| 5,832,988 | 11/1998 | Mistry et al. . |
| 6,040,981 * | 3/2000 | Schmitt et al. ........................ 361/695 |
| 6,071,082 * | 6/2000 | Lecinski et al. ........................ 361/695 |
| 6,075,698 * | 6/2000 | Hogan et al. ........................ 361/695 |

FOREIGN PATENT DOCUMENTS

003408139-A1 * 9/1985 (DE) .............................. H05K/7/20

OTHER PUBLICATIONS

Brigoni & Garimella, "experimental Optimization of Confined Air Jet Impingement on a Pin Fin Heat Sink", IEEE Transactions On Components and Packaging Technology, vol. 22, No. 3, Sep. 3, 1999, pp. 399–404.

Maveety & Hendricks, "A Heat Sink Performance Study Considering Material, Geometry, Nozzle Placement, and Reynolds Number with Air Impingement", ASME, vol. 121, Sep. 1999, pp. 156–161.

* cited by examiner

Primary Examiner—Leo P. Picard
Assistant Examiner—Boris L. Chervinsky
(74) Attorney, Agent, or Firm—Jones, Day, Reavis & Pogue

(57) ABSTRACT

A direct flow impingement cooling system for heat generating electronic components is disclosed. The system includes a panel containing the components and the panel is formed of a main housing and a cover housing hinged to move between opened and closed positions. Three fans are positioned downstream of three spiral shaped air intake patterns, each having 18 cone-shaped cutouts. Downstream of the fans is a back plate with three aligned openings and side wall air exhaust slots. Downstream of the slots are upper and side exhaust openings, where all of the openings provide for low impedance air flow such that high heat removal from densely packed components is achieved.

14 Claims, 5 Drawing Sheets

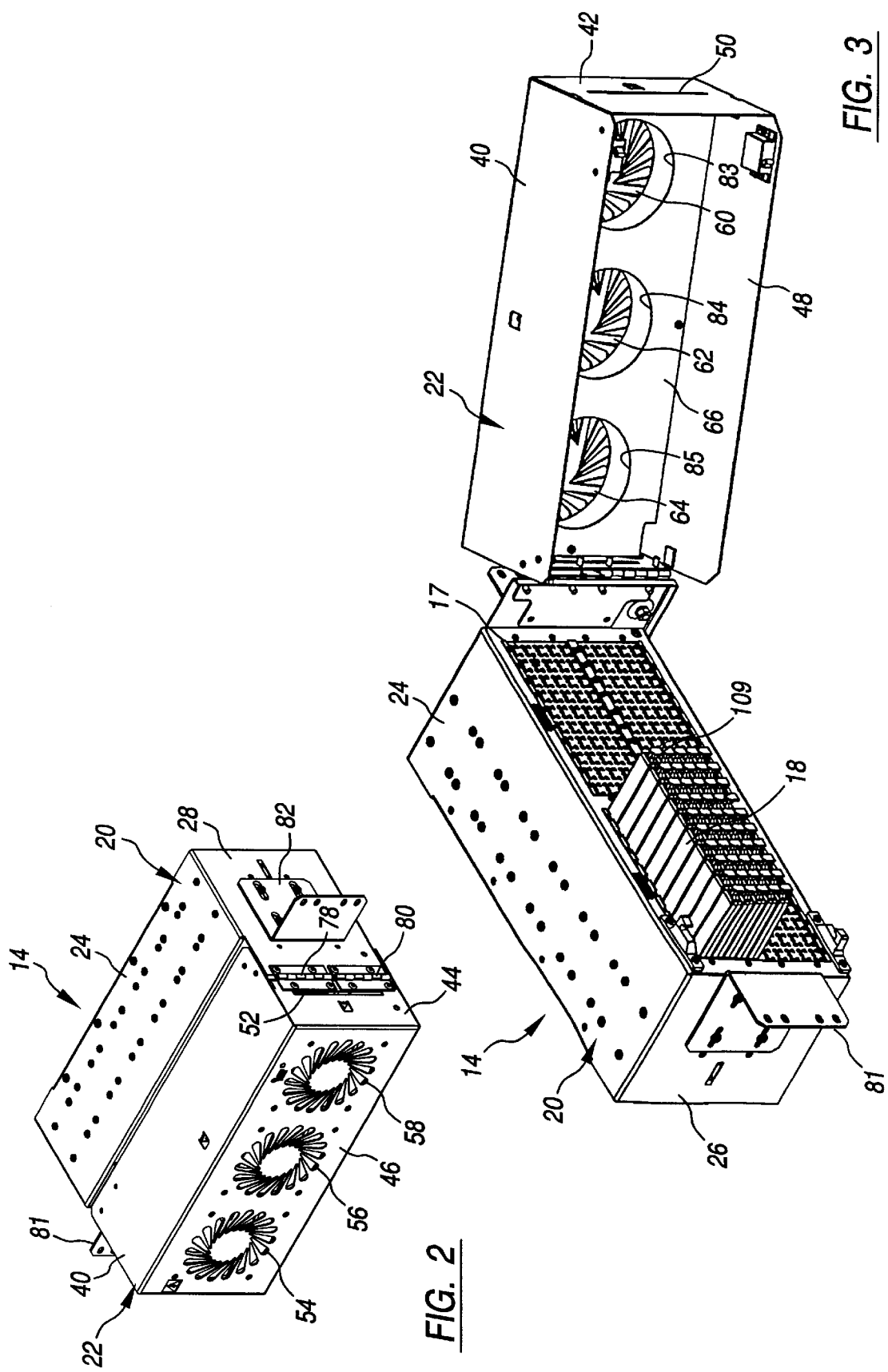

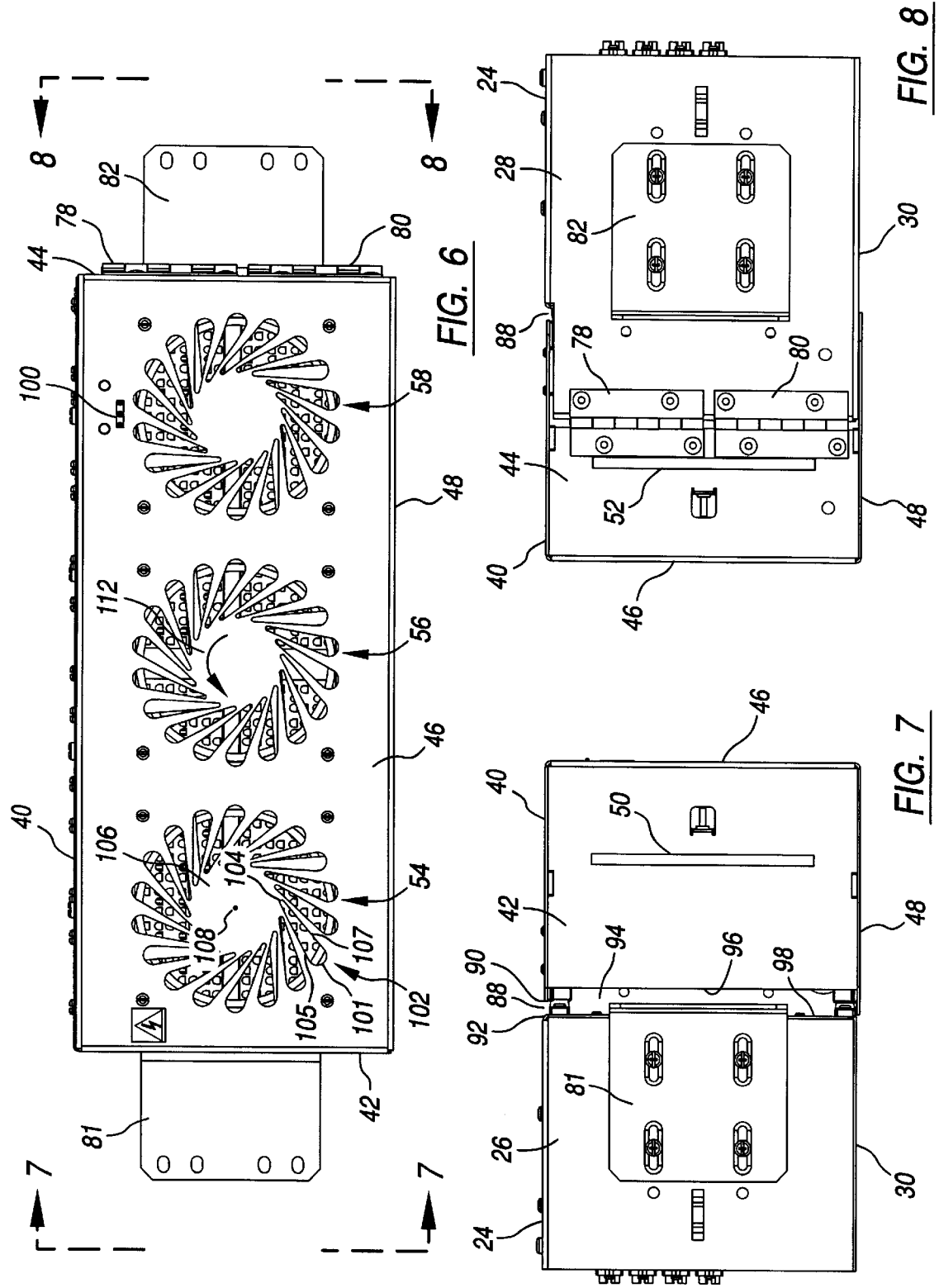

COOLING SYSTEM FOR ELECTRONIC COMPONENTS IN AN EQUIPMENT ENCLOSURE

BACKGROUND OF THE INVENTION

1. Field of the Invention

The present invention relates to a cooling system and more particularly to a direct flow impingement cooling system for electronic components mounted in panels in an equipment enclosure or cabinet.

2. Description of the Related Art

Various types of equipment for telephone, cable television, wireless applications and the like are placed out-of-doors in equipment enclosures which generally are free standing cabinets that are mounted to a concrete pad. As electronic components for this equipment have become more sophisticated and powerful, they have also generated more heat. Thus, thermal management for equipment cabinets have become increasingly important. Further, heat dissipation requirements vary greatly from one type of component to another.

Generally, the cabinets include an upper sealed chamber for most components, a lower battery chamber and end chambers. Heat management within the sealed chamber is handled by a heat exchanger or an air conditioning unit. However, in the end chambers there typically is no heat management device other than vents to the ambient air. Hence, components that are placed in the end chambers are generally heat insensitive. Nevertheless, supplemental cooling systems have been developed and used in end chambers when and where they are needed. For example, fan units such as the Marconi AIRACK brand fan assembly have been used for auxiliary cooling. The AIRACK fan assembly can be located anywhere within the end chamber racks containing electronic components so as to be adjacent to those components that have specific cooling needs.

Other mechanisms for cooling heat generating electronic components include small fans directly attached to heat sinks which are in turn attached to the heat generating electronic component such as a Pentium brand processor. Also, journal articles have been published dealing with equipment to achieve high convective heat transfer rates. For example, an article entitled "Experimental Optimization Of Confined Air Jet Impingement On A Pin Fin Heat Sink" was published in IEEE Transactions On Components And Packaging Technology, Volume 22, No. 3, at page 399 dated September 1999. Another article entitled "A Heat Sink Performance Study Considering Material, Geometry, Nozzle Placement, And Reynolds Number With Air Impingement" appeared in Transactions Of The ASME, Volume 121, at page 156, dated September 1999.

As more powerful electronic components are developed and put into use, a continuing need has developed for systems to cool these devices to ensure that they function properly and at more optimum levels.

BRIEF SUMMARY OF THE INVENTION

The present invention provides an improved cooling system for electronic components such as those used in uncooled end chambers of freestanding equipment cabinets, the system comprising a component panel formed of a main housing adapted to be mounted to a rack in the cabinet, the housing for containing heat generating electronic components, a cover housing having a front wall with openings for air flow, left and right side walls having exhaust openings, a plurality of fans mounted within the cover housing and located behind the front wall with each of the fans positioned behind one of the air flow openings, a back plate also mounted within the cover housing and located behind or downstream of the fans, and a hinge connecting the cover housing and the main housing for allowing the cover housing to move between opened and closed positions. The system effectively cools the components and also allows easy access for maintenance of the components within the panel.

An object of the present invention is to provide direct cooling of over-current protector modules mounted within an equipment cabinet. Another aspect of the present invention is to provide a cooling system for high heat removal from a densely packed equipment cabinet. Yet another advantage of the present invention is to provide a cooling system with sufficient heat removal capacity to allow the temperature of a handle of an over-current protector to be low enough to be safely touched by maintenance personnel. Still another aim of the present invention is to provide a cooling system to lower the temperature of densely packed over-current protectors to about 4° C. above ambient with less than a 2° C. difference across a filled panel. It is yet another object of the present invention to provide a cooling system to lower the internal temperature of an over-current protector module by as much as 45° C.

A more complete understanding of the present invention and other objects, aspects, aims and advantages thereof will be gained from a consideration of the following description of the preferred embodiment read in conjunction with the accompanying drawing provided herein.

BRIEF DESCRIPTION OF THE SEVERAL VIEWS OF THE DRAWING

FIG. 2 is a front isometric view of a panel containing current limiting protector modules shown with a cover housing in a closed position.

FIG. 3 is a front isometric view of the panel shown in FIG. 2 illustrating the cover housing in an open position.

FIG. 6 is a front elevation view of the panel shown in FIGS. 1, 2, 3 and 5.

FIG. 7 is a left side elevation view of the panel taken along line 7—7 of FIG. 6.

FIG. 8 is a right side elevation view of the panel taken along line 8—8 of

DETAILED DESCRIPTION OF THE INVENTION

Figure 1:
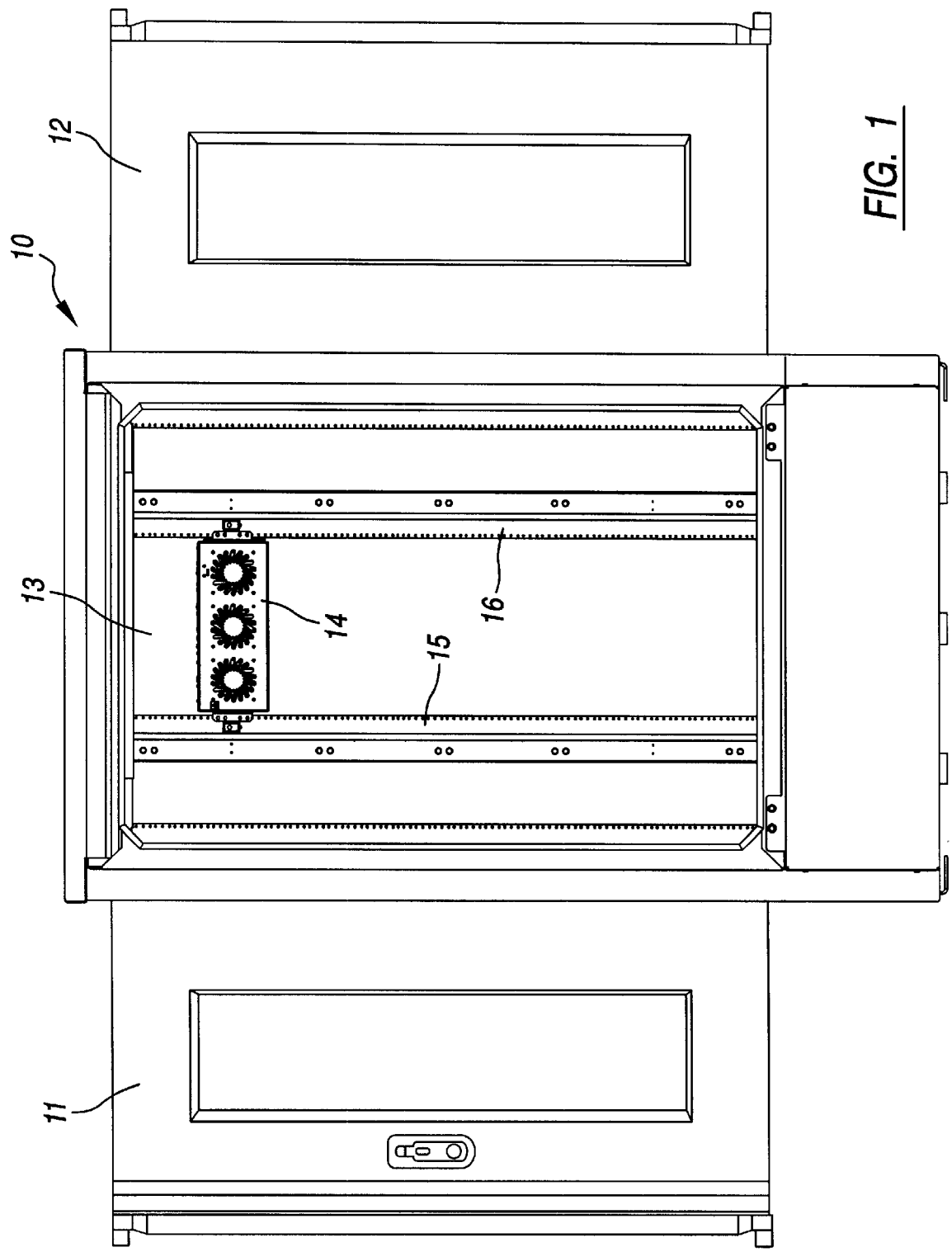
FIG. 1 is a front elevation view of an end chamber of an equipment cabinet with exposure of racks for mounting electronic components.

While the present invention is open to various modifications and alternative constructions, the preferred embodiment shown in the drawing will be described herein in detail. It is understood, however, that there is no intention to limit the invention to the particular form disclosed. On the contrary, the intention is to cover all modifications, equivalent structures and methods, and alternative constructions falling within the spirit and scope of the invention as expressed in the appended claims.

Referring to FIGS. 1, 2 and 3, there is shown an outdoor equipment cabinet 10 which is used to protect communication equipment, such as telephone, cable TV and wireless electronics, from dust, moisture, temperature extremes and other environmental conditions. The cabinets also allow efficient thermal management to keep internally mounted electronic components from exceeding their more optimal temperature ranges. The enclosure is generally designed to have at least one upper equipment chamber, two side chambers and a lower battery chamber. Typically, the upper chamber is sealed once the doors are closed and the air inside the chamber may be cooled by an air conditioner or a heat exchanger. Mounted within the enclosure are equipment racks to which the electronic equipment may be mounted. In FIG. 1, a front door 11 and a rear door 12 are shown in open positions and a side chamber 13 is exposed for clarity. Equipment cabinets are disclosed in U.S. Pat. Nos. 4,901,202; 5,001,602; 5,136,463; 5,832,988 and 5,570,740 and these disclosures are incorporated herein by reference. Protector modules are disclosed in U.S. Pat. Nos. 4,262,317 and 5,523,916 and these disclosures are also incorporated herein by reference.

The side chambers of equipment cabinets are usually not cooled and they house panels of equipment or other items not having undue sensitivity to ambient temperatures. For example, the side chamber 13 is shown with a mounted panel 14, attached to vertical racks 15 and 16. It is noted that only one panel is shown although a stack of such panels are usually mounted to the racks because interior cabinet space is usually scarce. When components such as optical network units are mounted in the panel, a front interior wall 17 formed by a protection panel is provided to which are mounted five pin protector modules, usually in multiple five by ten arrays, such as the array 18. In the panel shown, there is room for four arrays; however, only one array is shown for the sake of clarity. Each protector module provides overcurrent protection, and in normal operation such modules generate heat. Each protector is about three inches long, three-quarters of an inch wide and five-eighths of an inch high.

The present invention relates to a system for cooling the protector modules and thereby prolonging their lives and their usefulness. Cooling is provided by direct flow impingement, also called forced convection cooling. This cooling is done efficiently in that cooling power requirements are low and minimal cabinet space is used. For the panel arrays contemplated approximately 200 watts of heat are generated. In addition, customer specifications require that interior temperatures of such components in the side chamber be limited to 70° C. based upon a maximum ambient temperature of 65° C. In other words, the temperature should be no more than 5° C. above ambient.

Referring now to FIGS. 2 and 3 in more detail, the panel 14 is divided into a main housing 20 and a cover housing 22. The cover housing 22 encloses the protector modules and also mounts three fans. This provides for easy access to the protector modules, minimizes fan space and yet air flow characteristics are enhanced for effective cooling of the protector modules.

The main housing 20 includes a top wall 24, a left side wall 26, a right side wall 28 and a bottom wall 30, FIGS. 7 and 8. The cover housing 22 includes a top wall 40, a left side wall 42, a right side wall 44, a front wall 46 and a bottom wall 48. Formed in the left side wall 42 is an opening in the form of a vertically extending exhaust slot 50. Formed in the right side wall 44 is a second vertically extending exhaust slot 52. Three openings 54, 56 and 58 of generally circular pattern are provided in the front wall 46 for fan air intake.

Figure 4:
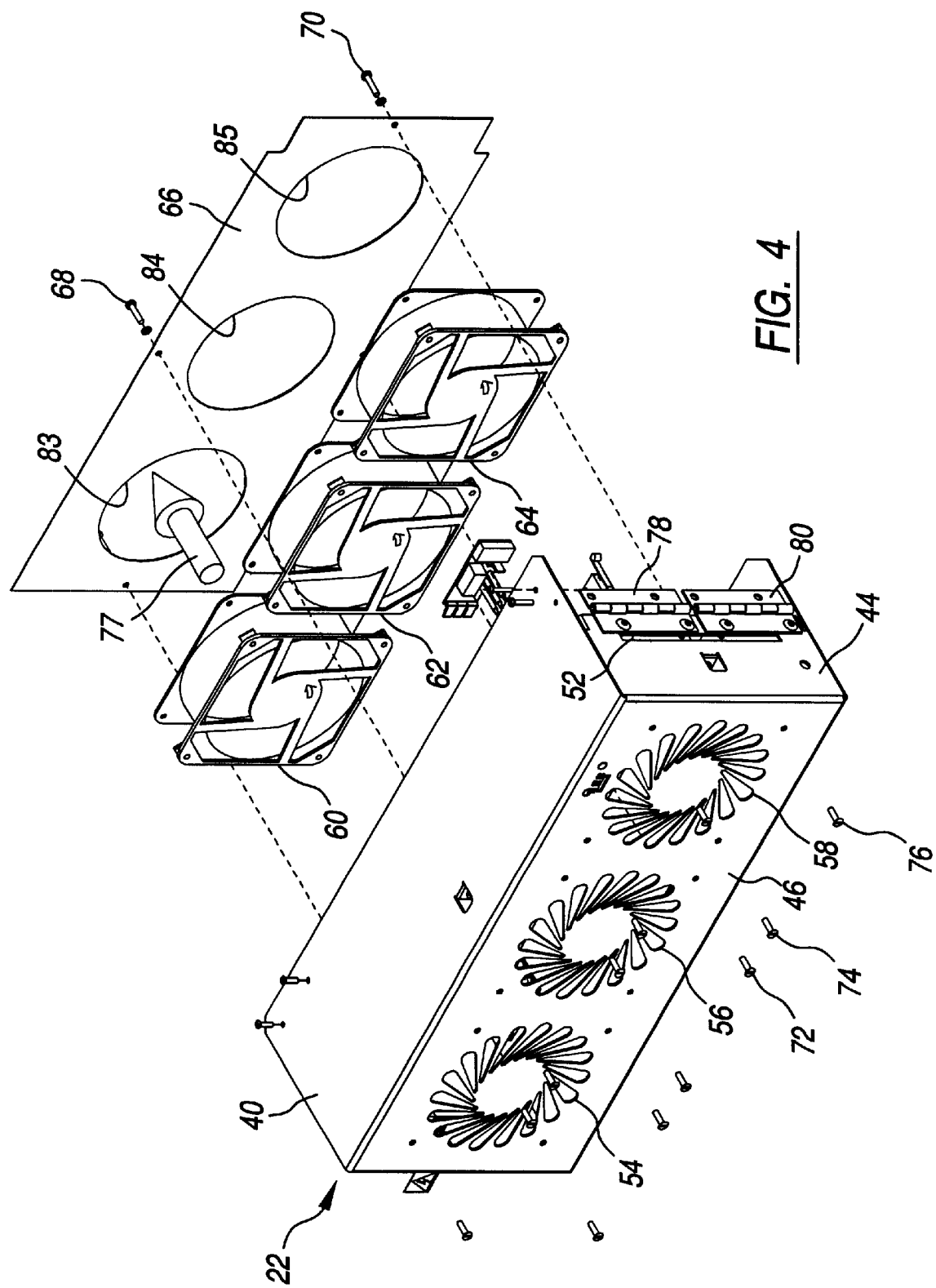
FIG. 4 is an exploded front isometric view of the cover housing.

Referring also now to FIG. 4, three fans 60, 62, 64 are mounted to the front wall 46 behind the openings 54, 56, 58, respectively. Behind or downstream of the fans is a back plate 66 which is mounted to the cover housing. Mounting of the back plate may be by any suitable means, such as screw fasteners exemplified by the screws 68, 70. In a similar manner, the fans may be attached to the cover housing by screws, exemplified by screws 72, 74, 76 located through the front wall 46. It should be noted that it is desirable to have a plurality of fans but the number may vary from three without departing from the present invention.

Figure 5:
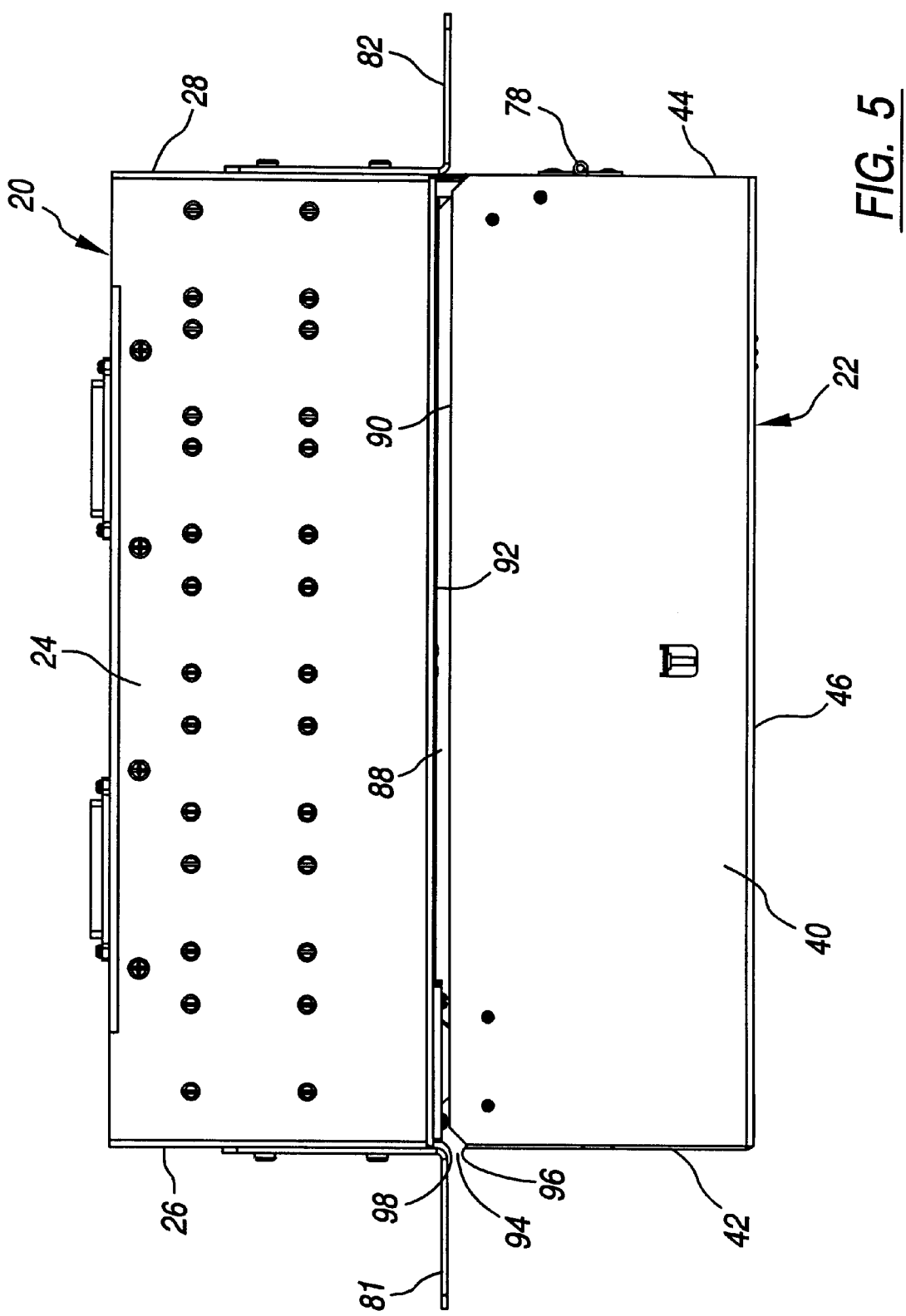
FIG. 5 is a top plan view of the panel shown in FIG. 2.

Connecting the cover housing 22 to the main housing 20 are a pair of aligned hinges 78, 80. One part of each hinge is connected to the right side wall 28 of the main housing 20 and the mating part of that hinge is connected to the right side wall 44 of the cover housing 22. This hinging arrangement allows the cover housing to move or rotate between an opened position as shown in FIG. 3 and a closed position as shown in FIG. 2. When the cover housing is open, access is available to the protector modules and other components for service or replacement. When the cover module is in a closed position, the protector modules are themselves protected and aligned with the fans for effective cooling. L-shaped side brackets 81, 82 are attached to the left and right side walls 26, 28, respectively to mount the panel to cabinet racks as shown in FIG. 1. Depending upon rack spacing and panel width, the brackets may be an extended type as shown in FIGS. 2, 5 and 6 or a short type as shown in FIG. 1.

In the embodiment shown, an air flow path (exemplified by the arrow 77, FIG. 4) is provided so that the fans provide direct flow impingement of air onto the densely packed protector modules. This flow proceeds through the three openings 54, 56, 58 in the front wall 46 of the cover housing as the fans suck the air from the ambient environment. The air then passes through the fans and through three openings 83, 84, 85 of the back plate 66 and, thereafter, directly upon the densely packed protector modules. The air flow is generally spiral until impingement upon the protector modules. The air flows generally along the modules until the interior wall 17 is reached. However, turbulence is created to increase the forced convection heat transfer coefficient.

Four exhaust openings have been selected to remove the heated air from within the cover housing. Two exhaust openings are the slots 50, 52 in the side walls 42, 44, respectively. Two additional exhaust slots are formed between the main housing and the cover housing. As seen in FIGS. 5, 6, 7 and 8, there is an opening 88 between a trailing edge 90 of the top wall 40 of the cover housing 22 on the one hand, and a leading edge 92 of the top wall 24 of the main housing 20 on the other hand. There is a second opening 94 formed by a trailing edge 96 of the left side wall 42 of the cover housing 22 and a leading edge 98 of the left side wall 26 of the main housing 20.

The opening 88 extends the width of the panel, about 17.5 inches, and is about a quarter of an inch wide. The opening 94 at the left side of the panel extends the height of the panel, about seven inches and is about 0.6 inches wide. The slots 50, 52 are each about five inches long and about a quarter inch wide. Further, the slots are about 2.1 inches downstream from the front wall 46, whereas the top opening 88 is about 5.4 inches from the front wall 46. The slots 50, 52 are located immediately downstream of the backplate 66. The side opening 94 is about 4.7 inches from the front wall 46 and the total depth of the panel in a closed condition is about 12.2 inches. The depth of the fans and back plate combined is about 1.5 inches. The interior wall 17 is about 5.7 inches from the front wall 46.

The fans are relatively inexpensive and have low power requirements. For example, fans sold by Comair-Rotron of San Ysidro, Calif., model "Muffin XL", having a 35 cubic feet per minute capacity and a 4.69 inch diameter are suitable for the panel described. It is anticipated that the fans will always be operating except when the cover housing is opened. When the cover housing pivots, the fans shut down for safety reasons and for noise abatement. A detector and alarm are provided for signaling when the cover housing is not closed and the fans are off, or if there is some other malfunction of the fans. The alarm may be connected in any suitable manner to a distant monitoring station and/or a light 100 may be placed in the front wall 46 to also signal that the fans are not operating or are malfunctioning.

The three front openings 54, 56, 58 have a spiral-like petal design offering a maximum opening consistent with safety. Extended ends, such as the end 101 of the opening 102, have a 0.212 inches radius while the opposite ends, such as the narrow end 104, have a radius of about 0.049 inches. This produces an ice cream cone shaped opening that will still shield fingers of maintenance or installation personnel from the fan and thus meet UL approval. The longitudinal distance from the radius center point to the radius center point is about 1.44 inches. There are eighteen such ice cream shaped cutouts per front opening pattern. It is also to be noted that the oblique longitudinal sides 105, 107 of the cone-shaped openings are angled about 13° apart. From one side of one opening to the same side of the next opening is 20°. From a center point of a pattern, such as the center point 108, to a first side of each opening, such as the side 105, is about 0.939 inches, and the distance from the center point of the pattern to the closest part of each opening from a line through the center point and rotated 10° from a horizontal, is about 0.559 inches. The outer diameter of each pattern is about 4.7 inches and the inner diameter is about 2 inches.

A center portion 106 for each opening formed within the inner diameter is solid because a fan hub is directly downstream and does not pass any air. Hence, the front opening patterns generally maximize the area of openness for air flow consistent with safety constrains and yet still provide a strong front wall. The spiral-like patterns also assist in moving air into the rotating fans (the fans rotate in a counterclockwise direction (represented by the arrow 112) when viewed from the front as in FIGS. 1 and 6) and minimize pressure drops across the front wall.

In operation, the air exiting the fan moves in a helical pattern until being "broker up" by the protector modules. The air becomes somewhat turbulent but continues to move downstream toward the interior wall 17. During this time, the air is passing the protector modules and carrying away heat. It has been found that the fans cause a 26° C. reduction in temperature of the protector modules from as much as 30° C. to 4° C. above ambient at the protector handle 109, FIG. 3 which allows the handle to be cool enough to the touch for removal of the protector module by maintenance personnel if desirable. At full current, handle temperatures may be as high as 30° C. above ambient. This may well be too hot to touch if ambient temperature is 65° C. By providing the direct impinging flow, the handle may be only 4° C. above ambient. It has also been found that there is a reduction in the range of temperatures across the panel by 18° C., from 20° C. to 2° C. Internal temperature of the protector modules may drop about 45° C. from a maximum.

Once the air flow encounters the internal wall, it generally moves upwards and sidewards in response to the openings 90, 92, and moves upstream in response to the slots 50, 52. These enhance heat removal and air flow. The panels are generally stacked in the racks a half inch apart so that air being exhausted through the upper opening 90 can dissipate. In a like manner, air exhausted through the side opening 92 can easily dissipate since there is no impedance. Air exhausting through the two slots 50, 52 moves from the interior wall upstream along the right and left side walls 42, 44 at increasing speed before departing the panel. The back plate 66 is provided to prevent the upstream flow from interfering with the downstream flow and to eliminate flow recirculation and flow bypass.

The exhaust openings and exhaust slots provide a relatively low pressure-drop means of removing the heated air from the panel. The internal heat generated by operation of the protectors moves to their outer surface by conduction and from there to the air flow by convection. The result of the invention described here is that substantial cooling benefits are achieved without a substantial penalty in energy costs, in material costs or in lost internal cabinet space. The heat removal is sufficient to allow protector module handles to be touched and to enhance protector operation.

The fans may be operated by the DC power of the batteries because power usage is low and this prevents cooling problems if there is a community power outage. The location of the fans inside the cover housing saves depth space of the panel and additional space in front or upstream of the fans reduces air flow impedance. The intake pattern also reduces flow impedance and enhances flow performance while increasing safety.

The specification describes in detail an embodiment of the present invention. Other modifications and variations will, under the doctrine of equivalents, come within the scope of the appended claims. For example, other enclosure chambers beside side chambers may find the panel construction described above to be useful. The panels may be stacked in multiple columns or rows and used more or less fans. These are still considered equivalent structures. Also, in some instances a bottom exhaust opening might be desirable when there is no panel stacked immediately below. Generally a half inch space between panels is believed to be insufficient to exhaust a lower panel through an upper opening and an upper panel through a lower opening. Still other alternatives will also be equivalent as will many new technologies. There is not desire or intention here to limit in any way the application of the doctrine of equivalents.

What is claimed is:

1. A cooling system for electronic components in an equipment cabinet, said system comprising:

a main housing adapted to be connected to a rack in a cabinet, said housing for containing electronic components;

a cover housing having a front wall with openings for air flow, a first side wall having a first exhaust opening and a second side wall having a second exhaust opening;

a plurality of fans mounted within said cover housing downstream of said front wall, each of said fans positioned downstream of one of said air flow openings;

a back plate mounted within said cover housing downstream of said plurality of fans, said back plate having a plurality of openings where each opening is aligned with a corresponding one of said plurality of fans; and a hinge connecting said cover housing to said main housing and allowing said cover housing to move between opened and closed positions.

2. A system as claimed in claim 1 wherein:

said first exhaust opening is a first slot in said first side wall; and said second exhaust opening is a second slot in said second side wall.

3. A system as claimed in claim 2 including:

a third exhaust opening, said third opening causing air flow to move upwardly, and a fourth exhaust opening, said fourth opening causing air flow to move sidewardly, both said third and said fourth openings being located between said main housing and said cover housing.

4. A system as claimed in claim 3 wherein:

said main housing includes a top wall, left and right side walls and a bottom wall;

said cover housing includes a top wall, said first and said second side walls, said front wall, and a bottom wall;

said first slot and said second slot are located immediately downstream from said back plate;

said third exhaust opening is located between said top wall of said main housing and said top wall of said cover housing; and said fourth exhaust opening is located between the left side wall of said main housing and said first side wall of said cover housing.

5. A system as claimed in claim 4 wherein:

each of said openings in said front wall of said cover housing form a spiral pattern of generally cone shaped cutouts, the larger end of said cone shaped cutouts being outwardly spaced and the smaller end of said cone shaped cutouts being inwardly spaced.

6. A cooling system for a panel of densely packed components comprising:

a main housing and a cover housing;

said cover housing forms an enclosure and has a front wall with a plurality of air intake openings;

a plurality of fans mounted within said cover housing, each fan located downstream of one of said plurality of air intake openings;

a back plate mounted within said cover housing downstream of said plurality of fans, said back plate having a plurality of openings, each of said back plate openings aligned with one of said plurality of fans; and a hinge connecting said cover housing to said main housing for allowing said cover housing to move between closed and opened positions.

7. A system as claimed in claim 6 wherein:

said cover housing includes a left side wall, a right side wall, a top wall and a bottom wall;

said main housing includes a left side wall, a right side wall, a top wall and a bottom wall; and including:

a first exhaust opening in said left side wall of said cover housing;

a second exhaust opening in said right side wall of said cover housing;

a third exhaust opening located between said top wall of said cover housing and said top wall of said main housing; and a fourth exhaust opening located between said left side wall of said cover housing and said left side wall of said main housing.

8. A system as claimed in claim 7 including:

an interior wall in said main housing adapted to mount heat generating components to be cooled; and wherein:

said first exhaust opening is a first slot being located immediately downstream of said back plate;

said second exhaust opening is a second slot being located immediately downstream of said back plate;

said third exhaust opening is located upstream of said interior wall; and said fourth exhaust opening is located upstream of said interior wall.

9. A system as claimed in claim 8 wherein:

each of said openings in said front wall of said cover housing forms a spiral pattern of generally cone-shaped cutouts, the larger end of each of said cone-shaped cutouts being outwardly spaced and the smaller end of each of said cone-shaped cutouts being inwardly spaced.

10. A cooling system for a panel of densely packed components comprising:

an enclosure for densely packed components, which components generate heat in operation;

a fan mounted within said enclosure for cooling said components;

a front wall of said enclosure positioned upstream of said fan, said wall including an opening in the form of a spiral pattern of generally cone-shaped cutouts.

11. A system as claimed in claim 10 wherein:

said spiral pattern having the larger end of each of said cone-shaped cutouts spaced outwardly in the pattern and the smaller end of each of said cone-shaped cutouts spaced inwardly in the pattern.

12. A system as claimed in claim 11 wherein:

the dimension of said larger end is formed by a radius of about 0.212 inches and the dimension of said smaller end is formed by a radius of about 0.049 inches; and the distance between center points of said radii is about 1.44 inches.

13. A system as claimed in claim 12 wherein:

the diameter of the fan is about 4.7 inches;

the outer diameter of the spiral pattern is about 4.7 inches; and the inner diameter of the spiral pattern is about 2 inches.

14. A system as claimed in claim 10 wherein:

said spiral pattern includes 18 cutouts.

* * * * *